US006671205B2

(12) United States Patent
Look

(10) Patent No.: US 6,671,205 B2
(45) Date of Patent: Dec. 30, 2003

(54) LOW VOLTAGE NON-VOLATILE MEMORY CELL

(75) Inventor: Kevin T. Look, Fremont, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/283,736

(22) Filed: Oct. 29, 2002

(65) Prior Publication Data
US 2003/0048663 A1 Mar. 13, 2003

Related U.S. Application Data

(62) Division of application No. 09/742,275, filed on Dec. 19, 2000, now Pat. No. 6,496,416.

(51) Int. Cl.[7] ............................................... G11C 7/00
(52) U.S. Cl. ...................... 365/185.18; 365/185.14; 365/185.24; 365/185.28
(58) Field of Search .................. 365/185.01, 185.14, 365/185.18, 185.24, 185.28

(56) References Cited

U.S. PATENT DOCUMENTS

| 5,621,964 | A | 4/1997 | Susnjara et al. |
| 5,627,400 | A | 5/1997 | Koga |
| 5,656,528 | A | 8/1997 | Wahlstrom |
| 5,821,160 | A | 10/1998 | Rodriguez et al. |
| 5,972,756 | A | 10/1999 | Kono et al. |
| 6,235,574 | B1 | 5/2001 | Tobben et al. |
| 6,495,424 | B2 * | 12/2002 | Kunikiyo ............ 438/296 |
| 6,496,416 | B1 * | 12/2002 | Look ............ 365/185.18 |
| 2002/0022326 | A1 * | 2/2002 | Kunikiyo ............ 438/296 |

FOREIGN PATENT DOCUMENTS

| JP | 360009160 A | 1/1985 |
| JP | 363079377 A | 4/1988 |
| JP | 406163906 A | 6/1994 |
| JP | 40623289 A | 8/1994 |
| JP | 406232389 A | 8/1994 |
| JP | 408264660 A | 10/1996 |
| JP | 2000077356 A | 3/2000 |

OTHER PUBLICATIONS

"Boron Diffusion and Penetration in Ultrathin Oxide with Poly–Si Gate"; Cao et al.; IEEE Electron Device Letters; vol. 19; No. 8; Aug. 1998; pp. 291–293.
"Flat–band Voltage Shifts in P–MOS Devices Caused by Carrier Activation in P+–Polycrystalline Silicon and Boron Penetration"; Aoyama et al.; 1997 IEEE; pp. 26.1.1–26.1.4.
"A PROM Element Based on Salicide Agglomeration of Poly Fuses in a CMOS Logic Process"; Alavi et al.; 1997 IEEE; pp. 34.3.1–34.3.4.
"Effects of Thermal Processes After Silicidation on the Performance of $TiSi_2$/Polysilicon Gate Device"; Jang et al.; IEEE Transactions on Electron Devices; vol. 46; No. 12; Dec. 1999; pp. 2353–2356.
"Comparison of Transformation to Low–Resistivity Phase and Agglomeration of $TiSi_2$ and $CoSi_2$"; Lasky et al.; IEEE Transaction on Electron Devices; vol. 38; No. 2; Feb. 1991; pp. 262–269.
"$CoSi_2$ Integrated Fuses on Poly Silicon for Low Voltage 0.18 um CMOS Application"; Kalnitsky et al.; 1999 IEEE; 4 pages.

* cited by examiner

*Primary Examiner*—Viet Q. Nguyen
(74) *Attorney, Agent, or Firm*—Bever Hoffman & Harms; Edel M. Young

(57) ABSTRACT

A memory cell comprises a multilayer gate heating structure formed over a channel region between source and drain regions. The multilayer gate heating structure comprises polysilicon and metal silicide layers stacked over a similarly shaped gate oxide. When a programming voltage is applied across the metal silicide layer, there is intense localized heating. The heating causes segregation of the channel dopant atoms towards the source and drain regions, lowering the threshold voltage of the device. The heating causes carrier activation in the polysilicon layer and dopant penetration through the oxide layer into the channel region, thereby increasing the threshold voltage of the device.

2 Claims, 5 Drawing Sheets

LOW VOLTAGE NON-VOLATILE MEMORY CELL

This application is a divisional of application Ser. No. 09/742,275 filed Dec. 19, 2000 now U.S. Pat. No. 6,496,416.

FIELD OF THE INVENTION

The present invention relates to a structure for measuring mask and layer alignment in semiconductor fabrication processes.

RELATED ART

A non-volatile memory cell is a memory cell that retains its stored information even if power is removed from the cell. In a conventional nonvolatile memory cell, a floating gate structure is commonly incorporated to provide this information storage function. FIG. 1 shows an example of a conventional floating gate memory cell 100. Memory cell 100 comprises a polysilicon floating gate 121 surrounded by an insulation material (e.g. silicon dioxide) 150. Floating gate 121 is located over a portion (channel) of a p-type body region 113 extending between an n-type source region 111 and an n-type drain region 112, all of which are formed in a substrate (e.g. silicon wafer) 101. A control gate 120 is located on the portion of insulation material 150 over floating gate 121. Source region 111, drain region 112, and control gate 120 are coupled to receive a source voltage Vs, a drain voltage Vd, and a gate voltage Vg, respectively.

Current between source region 111 and drain region 112 is controlled by the programmed/erased state of floating gate 121. This programmed/erased state is determined by the number of electrons stored (captured) in floating gate 121. In an unprogrammed state, a gate voltage Vg applied to control gate 120 controls the current flow between source region 111 and drain region 112 (i.e. memory cell 100 conducts when voltage Vg is HIGH, and does not conduct when voltage Vg is LOW). To program memory cell 100, electrons are injected into floating gate 121 until it stores a net negative charge that is sufficient to shift the threshold voltage of memory cell 100. Once programmed, memory cell 100 is nonconducting even when gate voltage Vg is HIGH.

Floating gate memory devices such as memory cell 100 typically require a relatively high voltage (i.e. substantially higher than the normal operating voltage of the IC) to inject electrons into (i.e. program) the floating gate. For example, a common operating supply voltage for modern integrated circuit (IC) devices is 3.3V. In such a case, unprogrammed memory cell 100 would be turned on (i.e. conduct current) with source region 111 at ground voltage and control gate 120 and drain region 112 both at 3.3V. However, to program memory cell 100, a programming voltage of 7.5V or greater might be required at control gate 120, with drain region 112 being held at 3.3V and source region 111 being held at ground voltage.

Because of this elevated programming voltage, conventional floating gate memory cells increase chip design complexity. Charge pump or other voltage enhancement circuits must be included into the IC design to provide the programming voltage, while isolation circuitry must be incorporated to prevent the raised voltages from damaging regular (non-memory) transistors in the IC. Floating gate memory cells also increase chip manufacturing complexity, as the floating gates are formed by an extra polysilicon deposition step that regular transistors do not require.

Accordingly, it is desirable to provide a nonvolatile memory cell that does not require an elevated programming voltage and does not require additional processing steps.

SUMMARY

The present invention provides a nonvolatile memory cell that does not include a floating gate, and therefore can be fabricated using the same process steps as regular transistors in an IC. Also, the nonvolatile memory cell of the present invention can be programmed without the use of elevated programming voltages, thereby simplifying the IC design.

A nonvolatile memory cell in accordance with an embodiment of the present invention comprises a diffusion region formed in a silicon substrate, source and drain regions formed in the diffusion region, and a gate heating structure spanning the diffusion region between the source and drain regions. According to an aspect of the present invention, the gate heating structure comprises an oxide layer that overlies the diffusion region, a doped polysilicon layer that overlies the oxide layer, and a metal silicide layer that overlies the polysilicon layer. Two gate contacts are coupled to the gate heating structure, one at each end of the metal silicide layer outside the channel region. According to an aspect of the invention, the metal silicide layer is a TiSi2 layer. According to another aspect of the invention, the metal silicide layer is a CoSi2 layer.

In an unprogrammed state, the memory cell of the present invention functions as a normal MOS transistor. A control voltage is applied to both gate contacts to control current flow between the source and drain regions. To program the cell, different voltages are applied to the gate contacts to provide a programming voltage across the gate heating structure. The programming voltage is selected to create enough heating in the TiSi2 layer to cause localized dopant atom movement. The heating structure is configured such that the programming voltage is less than or equal to standard on-chip voltages. The resultant dopant atom distribution is sufficient to affect the transistor action of the memory cell such that a control voltage applied to both gate contacts is insufficient to turn off the cell.

According to an aspect of the present invention, the diffusion region is a p-type region, while the source and drain regions are n-type regions. Current flow between the source and drain regions is controlled by a control voltage applied to both gate contacts. In an unprogrammed state, current flow is enabled when the control voltage is greater than an original threshold voltage of the memory cell. During a programming operation, heat generated by the gate heating structure causes the dopant atoms in the channel to segregate towards the source and drain regions. This segregation lowers the threshold voltage of the memory cell so that current flow between the source and drain regions is enabled even when the control voltage is less than the original threshold voltage.

According to another aspect of the present invention, the diffusion region is an n-type region, and the source and drain regions are p-type regions. The polysilicon layer of the gate heating structure is doped using a p-type dopant, such as boron. Current flow between the source and drain regions is controlled by a control voltage applied to both gate contacts. In an unprogrammed state, current flow is enabled when the control voltage is less than an original threshold voltage of the memory cell. During a programming operation, heat generated by the gate heating structure induces carrier activation in the polysilicon layer, and also causes dopant atoms in the polysilicon layer to penetrate the oxide layer and lodge in the channel region of the memory cell. As a result, the threshold voltage of the memory cell is raised such that current flow between the source and drain regions is enabled even when the control voltage is greater than the original threshold voltage.

Because the memory cell of the present invention uses temperature, rather than voltage, as a programming mechanism, the present invention eliminates the prior art problems associated with high voltage generation. Also, the memory cell of the present invention does not add any complexity or cost to the IC manufacturing process. Because the heating structure is similar to a conventional polycide gate and has no floating gate, the present invention eliminates the additional process steps required by the prior art.

The present invention will be more fully understood in view of the following description and drawings.

DETAILED DESCRIPTION

Figure 1:
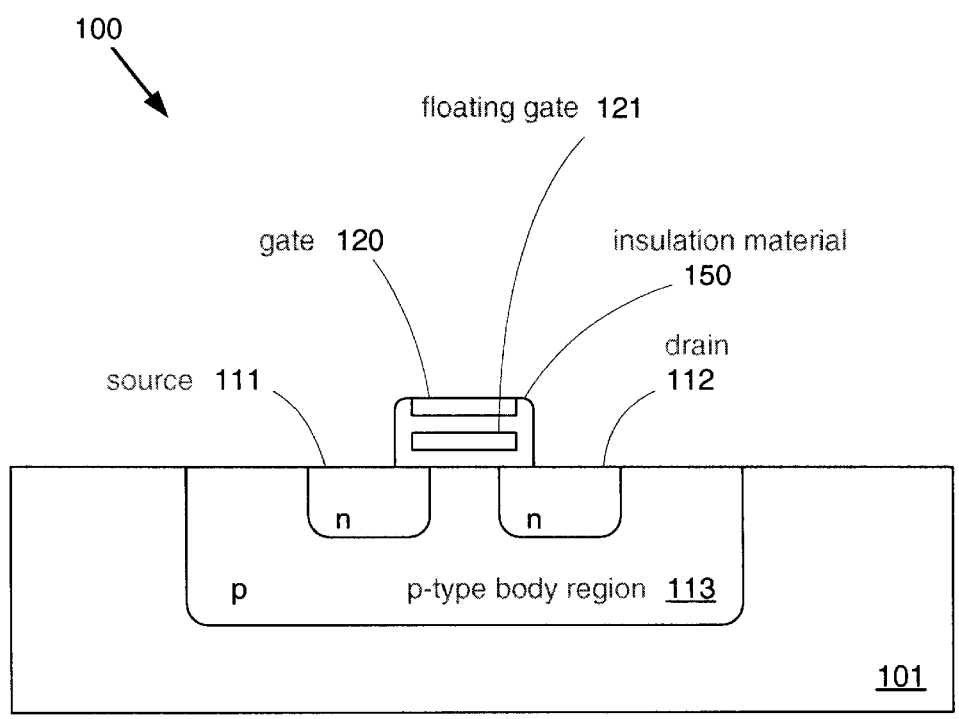
FIG. 1 is a diagram of a conventional nonvolatile memory cell.

As is known in the art, the mobility of carrier atoms (i.e. atoms providing the free electrons or holes) in a semiconductor material is enhanced by increasing temperature. However, this mobility can be problematic for conventional semiconductor devices. For example, the channel region for an NMOS transistor is often a boron-doped region of a silicon wafer between n-type source and drain regions. The excess of holes (i.e. positive free charge carriers) provided by the boron atoms can impede current flow between the source and drain regions until a gate voltage draws enough negative free charge carriers (i.e. electrons) into the channel region. A consistent boron distribution across the channel region is therefore required for proper transistor function. However, the high-temperature anneal processes commonly used in IC manufacturing process steps can cause segregation of the boron atoms in the channel region towards the source and drain regions, thereby reducing the semiconductor properties of the channel region.

This segregation effect was noted by Jang, et al. (hereinafter "Jang") in "Effects of Thermal Processes after Silicidation on the Performance of TiSi2/Polysilicon Gate Device", S 0018-9383(99)09025-5, 1999 IEEE, herein incorporated by reference. Jang describes a threshold voltage reduction in an NMOS device having a TiSi2 film over a polysilicon gate. Jang notes that as the anneal temperature of the device is raised from 750° C. to 850° C., device threshold voltages are significantly lowered. Jang posits that boron segregation from the channel region of the device toward the source/drain regions causes the change, and that further raising the BPSG anneal temperature would increase this segregation.

Elevated processing temperatures can also affect the boron atoms in the polysilicon gate region of an IC device. Heating of a polysilicon gate aligns the dopant atoms in the gate with its crystalline structure, thereby enhancing charge carrier mobility and improving the response of the device. However, this heating process can actually cause gate boron atoms to penetrate the gate oxide, thereby increasing the threshold voltage of the device by increasing the hole concentration in the channel region. This problem is exacerbated by the thin gate oxide layers used in modern semiconductor devices. In turn, the thin gate oxide issue was investigated by Cao, et al. (hereinafter "Cao") in "Boron Diffusion and Penetration in Ultrathin Oxide with Poly-Si Gate", *IEEE Electron Device Letters*, Vol. 19, No. 8, August 1998, herein incorporated by reference. Cao found that boron penetration through the oxide of a MOS capacitor increases with anneal temperature (from 1000° C. to 1040° C.), thereby causing an increase in flat band voltage.

A similar finding was reported by Aoyama, et al. (hereinafter "Aoyama"), in "Flat-Band Voltage Shifts in P–MOS Devices Caused by Carrier Activation in P+–Polycrystalline Silicon and Boron Penetration", Fujitsu Laboratories, Ltd., 0-7803-4100-7/97, IEDM 97-627, herein incorporated by reference. Aoyama formed MOS capacitors having p-type polysilicon gates over thin gate oxides formed on an n-type wafer substrate. Aoyama discovered that initial shifts in flat band voltage under anneal temperatures are due to carrier activation of the gate dopant (boron) atoms, whereas the subsequent, more substantial increases in flat band voltage are caused by gate dopant atom penetration through the gate oxide. Aoyama also observed that boron diffusivity increased with increasing anneal temperature (from 800° C. to 1100° C.), and that carrier activation in the polysilicon gates and boron penetration through the gate oxides occurred much more rapidly with higher anneal temperature (800° C. vs. 1000° C.). Aoyama further noted that flat band voltage shifts occurred much more rapidly at increased temperatures (800° C. vs. 900° C. vs. 1000° C.).

As noted above, the described effects all take place at high temperatures. Generally, such elevated temperatures are only applied to an IC during the manufacturing process, and ICs are typically designed to avoid generation of such temperatures "on-chip". However, it has been shown that agglomeration of a titanium silicide (TiSi2) layer in an IC can be induced using conventional on-chip voltages. TiSi2 is commonly used in polycide gate structures to improve device performance, and requires a post-deposition anneal to enter its desired low resistivity state. However, excessive anneal temperatures have been found to cause localized clumping of the TiSi2 (i.e. agglomeration), thereby leading to increased resistance and degraded device performance.

This effect was studied by Lasky et al., (hereinafter "Lasky") in "Comparison of Transformation to Low-Resistivity Phase and Agglomeration of TiSi2 and CoSi2", *IEEE Transactions on Electron Devices*, Vol. 38, No. 2, February 1991, herein incorporated by reference. Lasky's experimental data show that agglomeration of TiSi2 generally begins to occur at temperatures above 900° C., although the duration of the elevated temperature also affects the required agglomeration temperature. For example, agglomeration effects started to appear in the TiSi2 at 925° C. for a 50 second anneal time. With a 5 second anneal period, agglomeration was not noted until 975° C. Finally, for a "momentary" (i.e. less than one second) anneal, agglomeration effects began to appear at 1050° C. Lasky also looked briefly at the properties of cobalt silicide (CoSi2), finding that agglomeration occurred at 900 after 10 minutes for a CoSi2 layer over n+ polysilicon (though not for p+ polysilicon). [FIGS. 14, 19]

The increase in resistance caused by agglomeration was noticed and used by Alavi et al., (hereinafter "Alavi"), in "A PROM Element Based on Salicide Agglomeration of Poly Fuses in a CMOS Logic Process", Intel Corporation, Portland Technology Development, Hillsboro, Oreg., 0-7803-4100-7/97, 1997 IEEE, herein incorporated by reference. Alavi created a fuse structure comprising polysilicon elements shunted by a layer of TiSi2. To program the fuse, agglomeration was induced in the TiSi2 layer, thereby significantly increasing the fuse resistance. The heat required for programming was created via current stress in the TiSi2 layer, using nominal programming values of 2.5V and 10 mA at 100 ms. Fusing was noted at even lower settings (1V, 8 mA, 1 ms), but the nominal values were selected to ensure reliable and consistent programming.

The results from Lasky indicate that the fuses of Alavi require temperatures over 1000° C. to allow programming in the short time frames described (~100 ms). At the same time, Alavi was able to generate these high temperatures (i.e. induce agglomeration) using only 2.5V, a value well within normal supply levels for most ICs. Therefore, the combined results of Lasky and Alavi indicate that very high temperatures can be generated by on-chip devices using standard voltages.

Figure 2A:
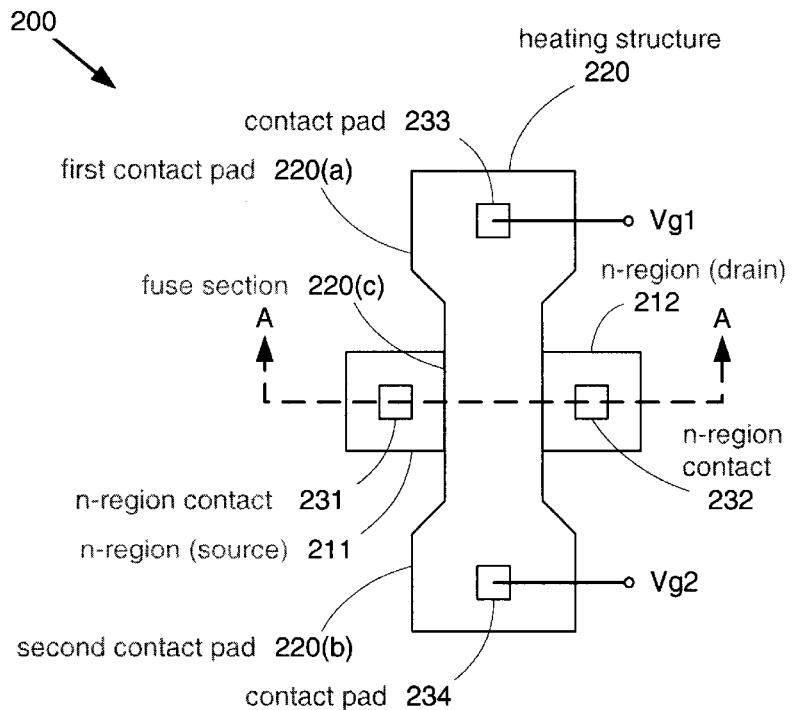
FIGS. 2a and 2b are diagrams of a nonvolatile memory cell in accordance with an embodiment of the present invention.

The present invention advantageously uses the aforementioned carrier atom mobility effects to provide data storage in a memory cell. FIG. 2a shows a nonvolatile memory cell 200 in accordance with one embodiment of the present invention. Cell 200 comprises an n-type source region 211 and an n-type drain region 212, both formed in a p-type region in a silicon substrate. Contacts 231 and 232 provide electrical connectivity with source region 211 and drain region 212, respectively. Cell 200 further comprises a heating structure 220. Gate heating structure 220 comprises a fuse section 220(c) between a first contact pad 220(a) and a second contact pad 220(b). Fuse section 220(c) overlies a channel region (not shown) between source region 211 and drain region 212. Contacts 233 and 234 are formed on contact pads 220(a) and 220(b), respectively, of heating structure 220. Contacts 233 and 234 are coupled to receive control voltages Vg1 and Vg2, respectively.

Figure 2B:
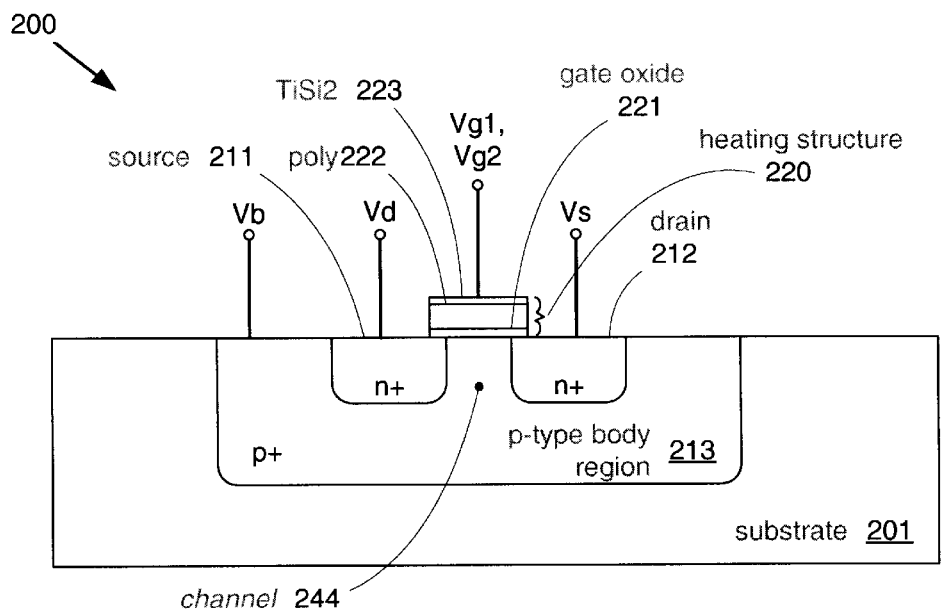

FIG. 2b shows a cross section A—A of nonvolatile memory cell 200 in accordance with an embodiment of the present invention. As shown in FIG. 2b, n-type source region 211 and n-type drain region 212 are formed in a p-type region 213, which is in turn formed in a silicon substrate 201. According to another aspect of the present invention, n-type regions 211 and 212 can be formed directly in a p-type substrate. FIG. 2b also shows the multilayer construction of gate heating structure 220. Gate heating structure 220 comprises a gate oxide layer 221 formed over channel region 244 between source region 211 and drain region 212, a polysilicon layer 222 formed over gate oxide layer 221, and a metal silicide layer 223 (e.g. titanium silicide (TiSi2), cobalt silicide (CoSi2), etc.) that overlies polysilicon layer 222. According to an aspect of the present invention, gate oxide layer 221, polysilicon layer 222, and metal silicide layer 223 share substantially the same outline.

The construction of gate heating structure 220 is substantially similar to that of a conventional polycide gate over and oxide layer. Therefore, memory cell 200 can be fabricated using a standard polycide or salicide process, without increasing manufacturing complexity.

When unprogrammed, memory cell 200 can be operated as a conventional NMOS transistor. Regions 211 and 212 are coupled to receive a source voltage Vs and a drain voltage Vd, respectively, while diffusion region 213 is coupled to receive a bulk voltage Vb. As described previously, heating structure 220 is coupled to receive voltages Vg1 and Vg2 at contacts 233 and 234, respectively. During operation as a transistor, voltages Vg1 and Vg2 are set equal to one another, providing a control voltage Vg to metal silicide layer 223 of gate heating structure 220. Control voltage Vg then regulates current flow between region 211 (source) and region 212 (drain) as in a conventional NMOS transistor.

Figure 2C:
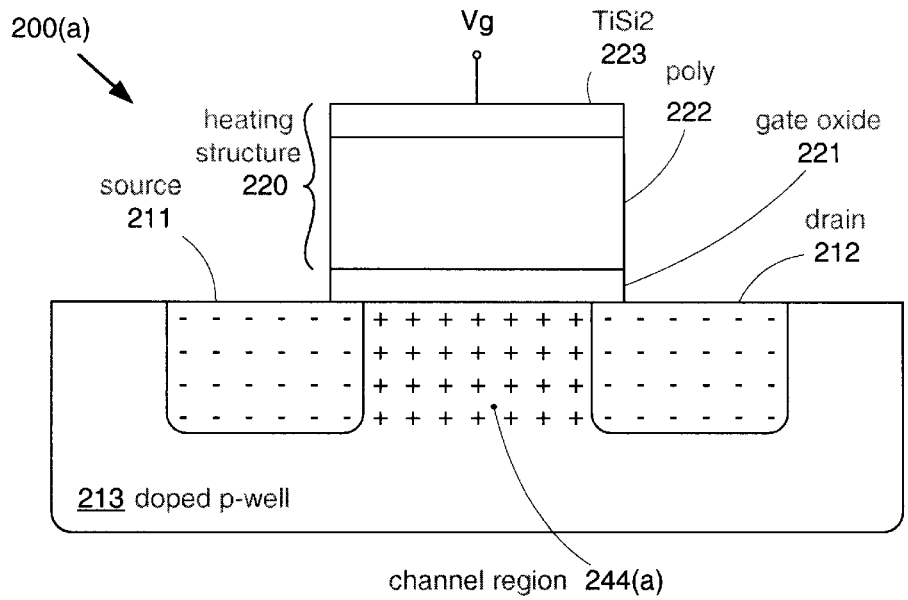
FIG. 2c is a diagram of the unprogrammed charge carrier distribution of the nonvolatile memory cell shown in FIGS. 2a and 2b.

FIG. 2c shows an enlarged cross section of an unprogrammed memory cell 200(a) in accordance with an embodiment of the present invention. When control voltage Vg is below a flat band voltage Vf, an excess of holes (+) from the p-type dopant atoms (boron, for example) in channel region 244(a) prevents current flow between n-type regions 211 and 212 (which can be formed using any n-type dopant atoms, such as arsenic or phosphorous). As control voltage Vg increases beyond flat band voltage Vf, the holes are pushed into the substrate. Concurrently, electrons (−) begin accumulating in channel region 244(a) to form a current path between regions 211 and 212. When control voltage Vg exceeds a threshold voltage Vt (which is greater than flat band voltage Vf), a complete inversion layer is formed in channel region 244(a) under gate oxide layer 221, and cell 200(a) is fully turned on.

To program memory cell 200(a), a programming voltage Vp is applied across heating structure 220 for a time period tp. According to an aspect of the present invention, programming voltage Vp is applied to contact 233 (i.e. Vg1 is set equal to Vp), and contact 234 is coupled to ground (i.e. Vg2 is connected to ground). Fuse section 220(c) is sized such that programming voltage Vp causes a programming current Ip to flow through metal silicide layer 223. This constant voltage stress heats up fuse section 220(c) and eventually agglomeration occurs. According to an aspect of the present invention, metal silicide layer 223 is an approximately 0.2 um thick TiSi2 layer, with fuse section 220(c) having a length of approximately 0.25 um and a width of approximately 2 um. Fuse section 220(c) can then be raised to agglomeration-level temperatures by a 100 ms (tp) exposure to 2.5V (Vp) at 10 mA (Ip). Alternative programming conditions and configurations for heating structure 220 will become apparent to one skilled in the art.

In this manner, metal silicide layer 223 can be heated to a high temperature (over 1000° C.) using normal on-chip voltages (i.e. programming voltage Vp can be less than or equal to the positive supply voltage of the IC). The temperature rise in metal silicide layer 223 heats channel region 244(a), enhancing dopant atom mobility. The p-type dopant atoms then segregate towards n-type regions 211 and 212, thereby freeing n-type charge carriers in channel region 244(a).

Figure 2D:
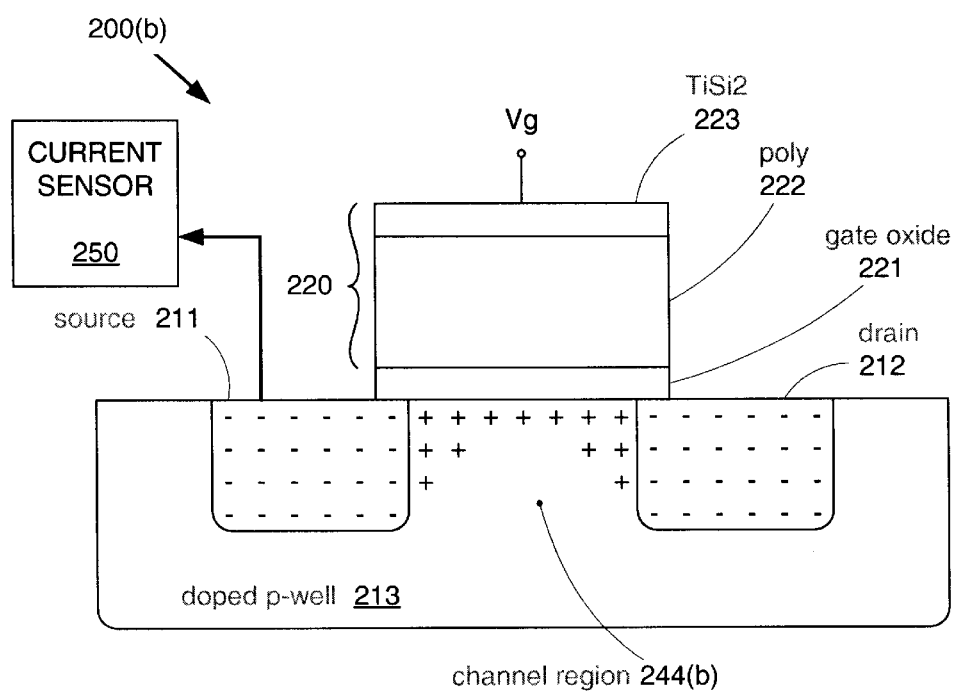
FIG. 2d is a diagram of the programmed charge carrier distribution of the nonvolatile memory cell shown in FIGS. 2a and 2b.

FIG. 2d shows an enlarged cross section of a programmed memory cell 200(b) in accordance with an embodiment of the present invention. Programmed cell 200(b) includes a channel region 244(b) in which the p-type dopant atoms have segregated towards regions 211 and 212. This p-type dopant atom migration results in reduced holes in the channel region to prevent current flows, hence reduces the threshold voltage of memory cell 200(b). Therefore, current flow between regions 211 and 212 is enabled even when control voltage Vg is less than original threshold voltage Vt. With sufficient p-type dopant atom segregation, cell 200(b) will conduct current even when control voltage Vg is equal to ground.

To read the state of memory cell 200, heating structure 220 is connected to ground (i.e. both contacts 233 and 234 are connected to ground), and a voltage potential is applied across regions 211 and 212. If current flows under those read conditions, then cell 200 is considered programmed. In contrast, if no current flows, then cell 200 is considered unprogrammed. According to one embodiment of the present invention, an optional current sensor 250 can be coupled to cell 200 to provide this current detection function. According to another embodiment of the present invention, control voltage Vg is set below flatband voltage Vf, and a programmed state is indicated if current sensor 250 detects current flow (thereby indicating that the magnitude of the threshold voltage for cell 200 has been reduced).

Figure 3A:
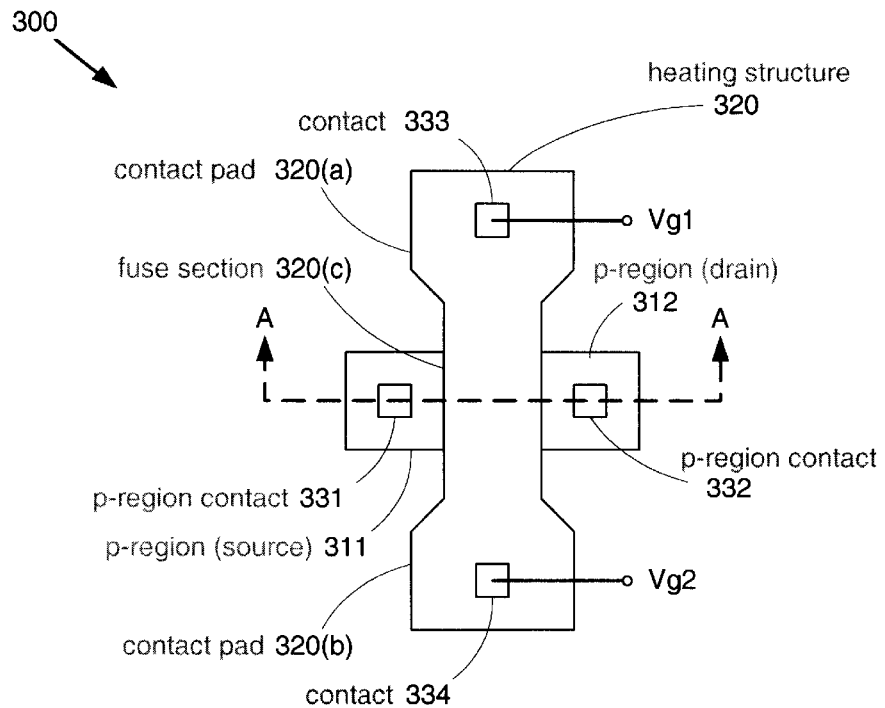
FIGS. 3a and 3b are diagrams of a nonvolatile memory cell in accordance with another embodiment of the present invention.

FIG. 3a shows a nonvolatile memory cell 300 in accordance with an embodiment of the present invention. Cell 300 comprises a p-type source region 311 and a p-type drain region 312, both formed in an n-type region in a silicon substrate. Contacts 331 and 332 provide electrical connectivity with source region 311 and drain region 312, respectively. Cell 300 further comprises a gate heating structure 320. Heating structure 320 comprises a fuse section 320(c) formed over the channel region between source region 311 and drain region 312 and contact pads 320(a) and 320(b) extending beyond both sides of the channel region. Contacts 333 and 334 are formed on contact pads 320(a) and 320(b), respectively, of heating structure 320. Contacts 333 and 334 are coupled to receive control voltages Vg1 and Vg2, respectively.

Figure 3B:
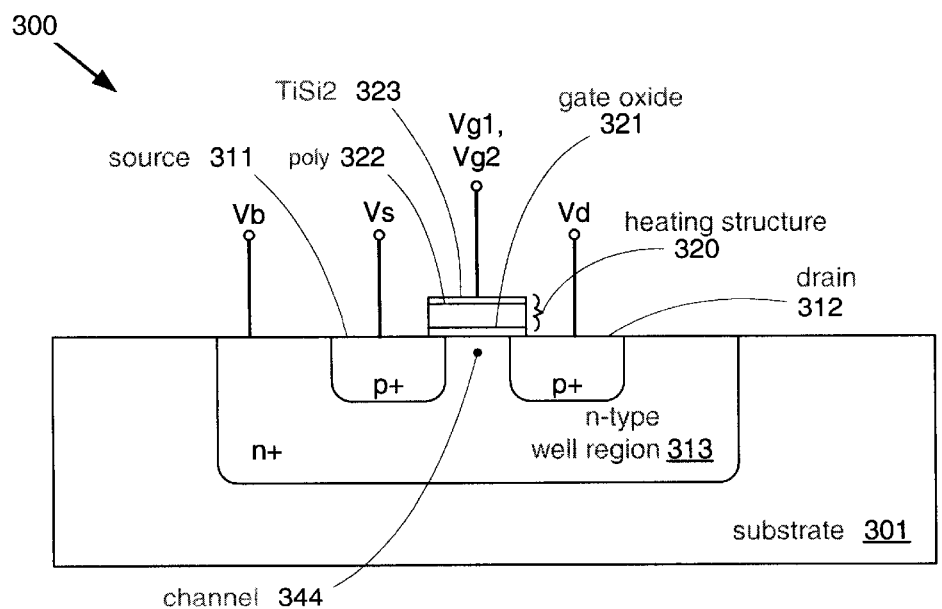

FIG. 3b shows a cross section A—A of nonvolatile memory cell 300 in accordance with an embodiment of the present invention. As shown in FIG. 3b, p-type source region 311 and p-type drain region 312 are formed in n-type region 313, which is in turn formed in a silicon substrate 301. According to another aspect of the present invention, p-type regions 311 and 312 can be formed directly in an n-type substrate. FIG. 3b also shows the multilayer construction of gate heating structure 320. Gate heating structure 320 comprises a gate oxide layer 321 formed over the channel region between source region 311 and drain region 312, a p-type doped polysilicon layer 322 formed over gate oxide layer 321, and a metal silicide layer 323 (e.g. titanium silicide (TiSi2), cobalt silicide (CoSi2), etc.) that overlies polysilicon layer 322. According to an aspect of the present invention, gate oxide layer 321, polysilicon layer 322, and metal silicide layer 323 share substantially the same outline.

The construction of heating structure 320 is substantially similar to that of a conventional polycide gate. Therefore, memory cell 300 can be fabricated using a standard polycide or salicide process, without adding any additional manufacturing complexity.

When unprogrammed, memory cell 300 can be operated as a conventional PMOS transistor. Regions 311 and 312 are coupled to receive a source voltage Vs and a drain voltage Vd, respectively, while diffusion region 313 is coupled to receive a bulk voltage Vb. Bulk voltage Vb is selected to ensure that the p-n junctions formed by p-type regions 311 and 312 and n-type region 313 are always reverse-biased to prevent leakage currents from developing. During operation as a transistor, voltages Vg1 and Vg2 are set equal to one another, providing a control voltage Vg to metal silicide layer 323 of gate heating structure 320. Control voltage Vg then regulates current flow between region 311 (source) and region 312 (drain) as in a conventional PMOS transistor.

Figure 3C:
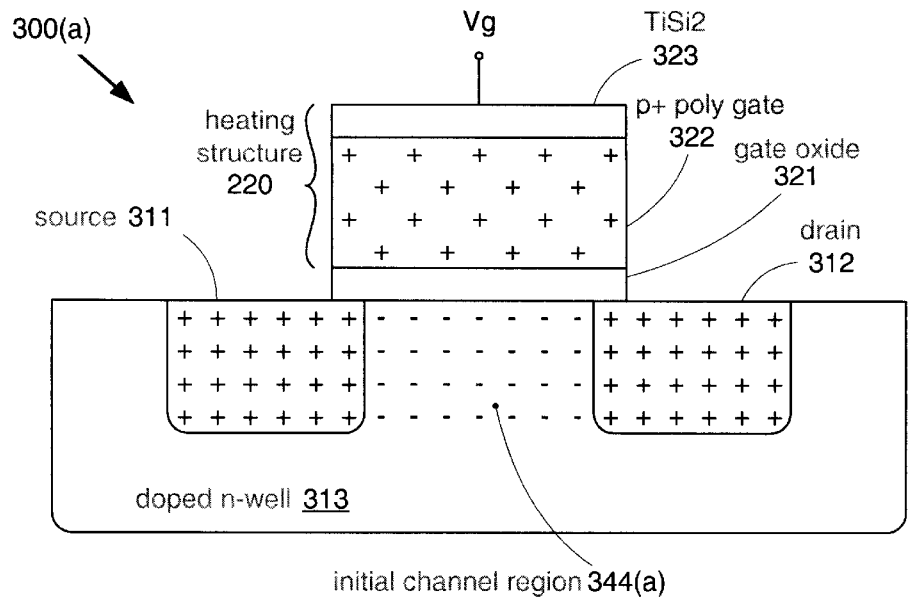
FIG. 3c is a diagram of the unprogrammed charge carrier distribution of the nonvolatile memory cell shown in FIGS. 3a and 3b.

FIG. 3c shows an enlarged cross section of an unprogrammed memory cell 300(a) in accordance with an embodiment of the present invention. When control voltage Vg is greater than a flat band voltage Vf, an excess of electrons (−) from the n-type dopant atoms in channel region 344(a) prevents current flow between p-type regions 311 and 312. As control voltage Vg decreases below flat band voltage Vf, the electrons are pushed into the substrate. Concurrently, holes (+) begin accumulating in channel region 344(a) to form a current path between regions 311 and 312. When control voltage Vg falls below a threshold voltage Vt (which is less than flat band voltage Vf), a complete inversion layer is formed in channel region 344(a) under gate oxide layer 321, and cell 300(a) is fully turned on. For example, in an IC using a positive supply voltage Vss, region 311 could be coupled to voltage Vss (i.e. Vs=Vss), region 312 could be coupled to ground (i.e. Vd=ground), and region 313 could be coupled to voltage Vss (i.e. Vb=Vss). Then, cell 300(a) is turned off when voltage Vg is coupled to positive supply voltage Vss, and is turned on when voltage Vg is connected to ground.

To program memory cell 300(a), a programming voltage Vp is applied across gate heating structure 320 for a time period tp. According to an aspect of the present invention, programming voltage Vp is applied to contact 333 (i.e. Vg1 is set equal to Vp), and contact 334 is coupled to ground (i.e. Vg2 is connected to ground). Fuse section 320(c) is sized such that programming voltage Vp causes a programming current Ip to flow through metal silicide layer 323. This constant voltage stress heats up fuse section 320(c) and eventually agglomeration occurs. According to an aspect of the present invention, metal silicide layer 323 is a 0.2 um thick TiSi2 layer, with fuse section 320(c) having approximate length 2 um and approximate length 0.25 um. Fuse section 320(c) of metal silicide layer 323 can then be raised to agglomeration-level temperatures by a 100 ms (tp) exposure to 2.5V (Vp) at 10 mA (Ip). Alternative programming conditions and configurations for heating structure 320 will become apparent to one skilled in the art.

In this manner, metal silicide layer 323 can be heated to a high temperature (over 1000° C.) using normal on-chip voltages (i.e. programming voltage Vp can be less than or equal to the positive supply voltage of the IC). The temperature rise in metal silicide layer 323 heats underlying p-doped polysilicon layer 322. The effects of this heating are twofold. First, the increased temperature induces carrier activation in polysilicon layer 322, which increases flat band voltage Vf (and threshold voltage Vt) of memory cell 300(a). Second, the heating also excites the dopant atoms in polysilicon layer 322, eventually causing some penetration through gate oxide layer 321 into channel region 344(a), further increasing flat band voltage Vf.

Figure 3D:
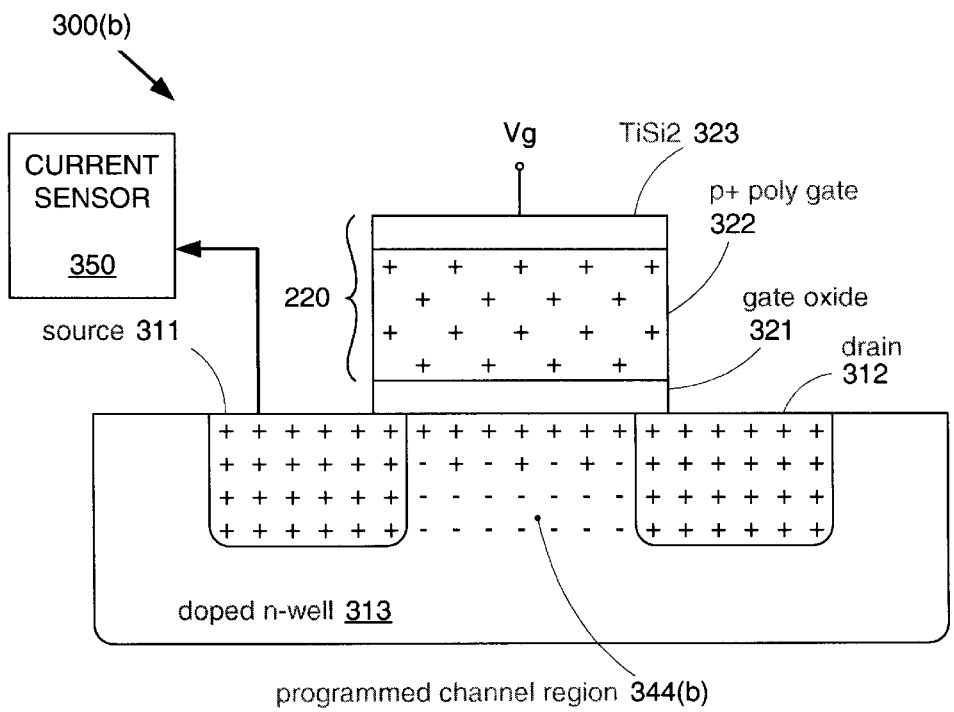
FIG. 3d is a diagram of the programmed charge carrier distribution of the nonvolatile memory cell shown in FIGS. 3a and 3b.

FIG. 3d shows an enlarged cross section of a programmed memory cell 300(b) in accordance with an embodiment of the present invention. Programmed cell 300(b) includes a channel region 344(b) into which p-type dopant atoms from polysilicon layer 322 have penetrated. These newly introduced dopant atoms create a p-type charge carrier layer that increases the threshold voltage of cell 300(b), which has already been increased by the carrier activation in polysilicon layer 322. Therefore, current flow between regions 311 and 312 is enabled even when control voltage Vg is greater than original threshold voltage Vt or flat band voltage Vf.

To read the state of memory cell 300, a voltage potential is applied across regions 311 and 312, an appropriate bulk voltage is applied to region 313, and gate heating structure 320 is coupled to a voltage Vg greater than the original threshold voltage Vt. If current flows under those read conditions, cell 300 is considered programmed, and if no current flows, cell 300 is considered unprogrammed. According to an embodiment of the present invention, an optional current sensor 350 can be coupled to cell 300 to provide this current detection function. According to another embodiment of the present invention, control voltage Vg is set to be greater than flat band voltage Vf, and a programmed state is indicated if current sensor 350 detects current flow (thereby indicating that the threshold voltage for cell 300 has been increased).

Thus, a low-voltage nonvolatile memory cell has been described. Although the invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A method for programming a memory cell, the memory cell comprising a well region in a semiconductor substrate, a first doped region and a second doped region formed in the well region, an oxide layer formed over a channel region in the well region between the first doped region and the second doped region, a polysilicon layer formed over the oxide layer, and a metal silicide layer formed over the polysilicon layer, the method comprising the step of heating the channel region to cause segregation of the dopant atoms in the channel region towards the first doped region and the second doped region.

2. The method of claim 1, wherein the step of heating the channel region comprises the step of applying a programming voltage across the metal silicide layer, the metal silicide layer being configured to agglomerate over the channel region when subjected to the programming voltage.

* * * * *